United States Patent
Buynoski et al.

(10) Patent No.: US 6,380,057 B1
(45) Date of Patent: Apr. 30, 2002

(54) ENHANCEMENT OF NICKEL SILICIDE FORMATION BY USE OF NICKEL PRE-AMORPHIZING IMPLANT

(75) Inventors: Matthew S. Buynoski, Palo Alto; George Jonathan Kluth, Los Gatos, both of CA (US); Paul R. Besser, Austin, TX (US); Paul L. King, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,225

(22) Filed: Feb. 13, 2001

(51) Int. Cl.[7] .......................................... H01L 21/3205
(52) U.S. Cl. ...................... 438/592; 438/303; 438/301; 438/514; 438/664
(58) Field of Search ................... 438/592, 649, 438/655, 682–683, 663–664, 595, 299–305, 514

(56) References Cited

U.S. PATENT DOCUMENTS

| | | | |
|---|---|---|---|
| 5,027,185 A | * | 6/1991 | Liauh ........................ 359/59 |
| 5,352,631 A | * | 10/1994 | Sitaram et al. ............. 438/300 |
| 5,932,893 A | * | 8/1999 | Miyanaga et al. ............ 257/66 |
| 5,994,747 A | * | 11/1999 | Wu ............................ 257/408 |
| 6,150,243 A | * | 11/2000 | Wieczorek et al. ......... 438/558 |

FOREIGN PATENT DOCUMENTS

| | | | | |
|---|---|---|---|---|
| JP | 407038104 | * | 2/1995 | ......... H01L/21/336 |
| WO | 9833206 | * | 7/1998 | ........... H01L/21/28 |

* cited by examiner

Primary Examiner—Charles Bowers
Assistant Examiner—Thanh Nguyen

(57) ABSTRACT

Nickel salicide processing is implemented by implanting nickel into the active regions, prior to depositing Ni, to catalyze the reaction of Ni and Si during annealing to form a NiSi layer on the polysilicon gate electrodes and source/drain regions without the formation of rough interfaces between the nickel silicide layers and underlying silicon and without conductive bridging between the metal silicide layer on the gate electrode and the metal silicide layers on associated source/drain regions, particularly in the presence of silicon nitride sidewall spacers.

16 Claims, 2 Drawing Sheets

ENHANCEMENT OF NICKEL SILICIDE FORMATION BY USE OF NICKEL PRE-AMORPHIZING IMPLANT

FIELD OF THE INVENTION

The present invention relates to semiconductor device fabrication, particularly to self-aligned silicide (salicide) technology.

BACKGROUND ART

As gate electrode lengths are scaled down, the source and drain junctions and polycrystalline silicon line width must also be scaled down. However, scaling down the source and drain junctions and polycrystalline line width increases parasitic resistance in the source and drain diffusion layers and the gate electrode, and also increases the sheet and contact resistance of the gate electrode and source/drain regions.

Salicide technology comprises forming metal silicide layers on the source/drain regions and/or on the gate electrode of a semiconductor device in a self-aligned manner. A conventional approach to reduce resistivity involves forming a multi-layered structure comprising a low resistance refractory metal silicide layer on a doped polycrystalline silicon, typically referred to as a polycide. Salicide technology reduces parasitic sheet and contact resistance in the source and drain diffusion layers and the gate electrode that results from scaling down the source and drain junctions and polycrystalline silicon line width.

Silicides are typically formed by reacting a metal with silicon (Si) within a specified temperature range for a specific period of time. Silicide layers are self-aligned. Sidewall spacers, e.g., silicon nitride or silicon dioxide, are formed on the side surfaces of the gate electrode, followed by a blanket deposition of metal and annealing to react the metal with Si in the gate electrode and the source/drain regions, while the sidewall spacers prevent reaction with Si from the side surfaces of the gate electrode.

During annealing, the wafer is heated to a reaction temperature and held at the reaction temperature for a period of time sufficient for the metal layer to react with underlying Si to form a metal silicide layer on the source/drain regions and the gate electrode. Multiple annealing steps may be employed.

Various metals react with Si to form a metal silicide, however, titanium (Ti) and cobalt (Co) are currently the most common metals used to create metal silicides when manufacturing semiconductor devices utilizing salicide technology. However, Ti and Co silicides have certain characteristics that negatively impact semiconductor device performance.

Titanium silicide imposes high sheet resistance for lines narrower than 0.35 micrometers. For example, as $TiSi_2$ is formed in narrower and narrower lines, the resistance increases. Another significant limitation is that $TiSi_2$ initially forms a high resistivity phase (C49), and transformation from C49 to a low resistivity phase (C54) is nucleation limited, e.g., a high temperature is required to affect the phase change.

Cobalt silicide, unlike $TiSi_2$, exhibits less linewidth dependence of sheet resistance. However, $CoSi_2$, like $TiSi_2$, still consumes significant amounts of Si during formation, which increases the difficulty of forming shallow junctions. Large Si consumption is also a concern where the amount of Si present is limited, for example, with Si on insulator (SIO) substrates. Without enough Si to react with Co to form $CoSi_2$, a thin layer of $CoSi_2$ results and the silicide lacks the properties needed to ensure that the device functions properly. The thickness of the metal silicide layer is an important parameter because a thin metal silicide layer is more resistive than a thicker metal silicide layer of the same material. Therefore, thicker metal silicide layers increase semiconductor device speed, while thinner metal silicide layers reduce device speed.

Recently, attention has turned towards nickel (Ni) to form nickel silicide utilizing salicide technology. Nickel silicide avoids many limitations associated with $TiSi_2$ and $CoSi_2$. Unlike Ti where Si diffuses into the metal layer when forming a Ti silicide, Ni, like Co, diffuses into Si, which helps to limit bridging between the metal silicide layer on the gate electrode and a metal silicide layer on the associated source/drain regions. The formation of nickel silicide requires less Si than $TiSi_2$ and $CoSi_2$. Nickel silicide also exhibits almost no line width dependence on sheet resistance. Nickel silicide is normally annealed in a one step process, vis-à-vis a process requiring an anneal, an etch, and a second anneal, as occurs in $TiSi_2$ and $CoSi_2$ saliciding. In addition, nickel silicide exhibits lower film stress, i.e., causes less wafer distortion, than conventional Ti or Co silicides.

Although the use of Ni in salicide technology has certain advantages over using Ti or Co, there are problems associated with Ni. Metal silicide resistivity and, thus, semiconductor device performance, varies based on whether the silicide is metal-rich. Low resistivity is the preferred phase for metal suicides, including nickel silicide, as it improves device performance in the areas of switching speed and source to drain drive current. It is difficult to control nickel silicide transformation with conventional salicide technology in a manner that effects transformation to the desirable NiSi low resistivity phase from the undesirable $Ni_2Si$ high resistivity phase without forming rough interfaces between the nickel silicide layers and underlying Si or bridges between the nickel silicide layer on the gate electrode and a nickel silicide layers on the associated source/drain regions.

The transformation to a low resistivity nickel silicide is affected by the temperature at which annealing occurs. In order to fully convert $Ni_2Si$ to NiSi, annealing typically must occur at 400° C. or greater. However, the higher annealing temperatures result in rough interfaces between the nickel silicide layer and the underlying Si layer. A rough interface increases junction leakage, creates the possibility of spiking, and limits the thickness to which the silicide layer can be grown, all of which adversely affect semiconductor performance.

In addition to the problems associated with smooth interface formation, undesirable bridging is encountered at conventional annealing temperatures, particularly when silicon nitride sidewall spacers are used. Sidewall spacers typically comprise silicon dioxide or silicon nitride, but silicon nitride sidewall spacers are often preferable because silicon nitride is highly conformal and the sidewall spacers can be added and removed as needed throughout out the manufacturing process. However, at typical annealing temperatures, conductive bridges form between the nickel silicide layer on the gate electrode and the nickel silicide layers on associated source/drain regions when the heat causes nickel silicide to creep out of the active regions across the surface of the spacers. Such bridging interferes with semiconductor device performance by creating electrical shorts between different regions of the semiconductor device.

There exists a need for salicide technology that enables the formation of a low resistivity nickel silicide layer on the gate electrode and source/drain regions of a semiconductor device without the formation of rough interfaces between the nickel silicide layer and the underlying Si or bridging between the nickel silicide layer on the gate electrode and the nickel silicide layers on associated source/drain regions, particularly when using silicon nitride sidewall spacers.

DISCLOSURE OF THE INVENTION

These and other needs are met by embodiments of the present invention, which provide a method of salicide processing in semiconductor device fabrication, the method comprising forming a crystalline silicon substrate, forming a gate dielectric layer on the silicon substrate, and a gate electrode on the gate dielectric layer, forming source/drain regions, forming an oxide liner on the side surfaces of the gate electrode, forming silicon nitride sidewall spacers on the oxide liner, implanting nickel into the exposed source/drain regions to amorphize an upper portion thereof, depositing nickel over the wafer, heating the wafer to recrystallize the implanted source/drain regions and to react the nickel with underlying Si to form a nickel silicide layer on source/drain regions and the gate electrode, and removing unreacted nickel from the wafer.

An advantage of the present invention is the ability to catalyze formation of a low resistivity phase nickel silicide layer, e.g., NiSi, by implanting Ni into the active regions prior to nickel deposition and annealing. Implantation enables control over the silicidation reaction by catalyzing the reaction upon annealing between the subsequently deposited Ni layer and the silicon substrate amorphized by the implanted Ni.

The present invention advantageously enables a reduction in the temperature required to form a low resistivity nickel silicide layer, e.g., NiSi, on the gate electrode and source/drain regions. Nickel implantation catalyzes formation of a low resistivity nickel silicide layer, e.g., NiSi, at an annealing temperature of approximately 300° C. to approximately 400° C., a reduction from the conventional temperature level of 400° C. and greater. By reducing the annealing temperature required to effect silicidation, the present invention beneficially forms smooth interfaces between the resulting nickel silicide layers on the gate electrode and associate source/drain regions and the underlying silicon, thereby preventing junction leakage and spiking, and improving the thickness to which the silicide layer can be grown.

The reduced annealing temperature also affords improved semiconductor device performance by avoiding conductive bridges typically associated with higher annealing temperatures, which causes nickel silicide to creep out of the active regions onto the surface of the sidewall spacers. Nickel silicide creeping leads to conductive bridges between the metal silicide layer formed on the gate electrode and the metal silicide layers formed on the associated source/drain regions.

Other advantages of the present invention will become readily apparent to those skilled in the art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

Figure 1:
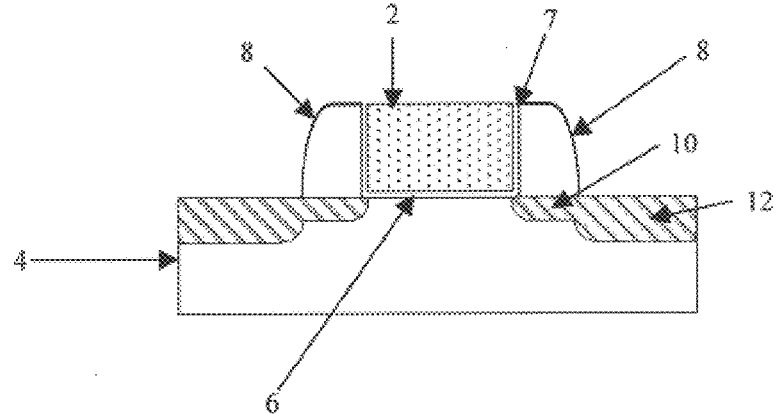
FIGS. 1–3 schematically illustrate sequential phases in a conventional salicide technique employing silicon nitride sidewall spacers resulting in rough interfaces between the nickel silicide layers and the underlying silicon layers, and conductive bridging between the metal silicide layer on the gate electrode and the metal silicide layers on associated source/drain regions.

The present invention addresses and solves problems related to forming a metal silicide layer on the gate electrode and source/drain regions of a semiconductor wafer. As device geometries shrink into the deep sub-micron regime, metal silicide bridging occurs along the surface of silicon nitride sidewall spacers between the metal silicide layer on the gate electrode and metal silicide layers on associated source/drain regions. For example, adverting to FIG. 1, in attempting to implement nickel silicide technology utilizing silicon nitride sidewall spacers, a gate electrode 2 is formed on silicon substrate 4 with a gate insulating layer 6 therebetween. An oxide liner 7 is disposed as a buffer layer on the side surfaces of the gate electrode 2. A conformal layer of silicon nitride is then deposited followed by anisotropic etching to form silicon nitride sidewall spacers 8 on the oxide liner 7. After anisotropic etching, contaminants such as etching residues are removed by wet cleaning. A thin oxide layer, as at a thickness of about 10 Å to about 15 Å, is formed on the exposed surfaces of silicon nitride sidewall spacers 8, on the exposed upper surface of gate electrode 2 and on the exposed surface of substrate 4, acting as a barrier layer preventing nickel silicidation. Sputter etching in argon is then conducted to remove the thin oxide layer from the exposed surfaces of the silicon nitride sidewall spacers 8, from the upper surface of the gate electrode 2 and from the exposed surface of substrate 4. Shallow source/drain extensions 10 and source/drain regions 12 are formed in a conventional manner.

Figure 2:
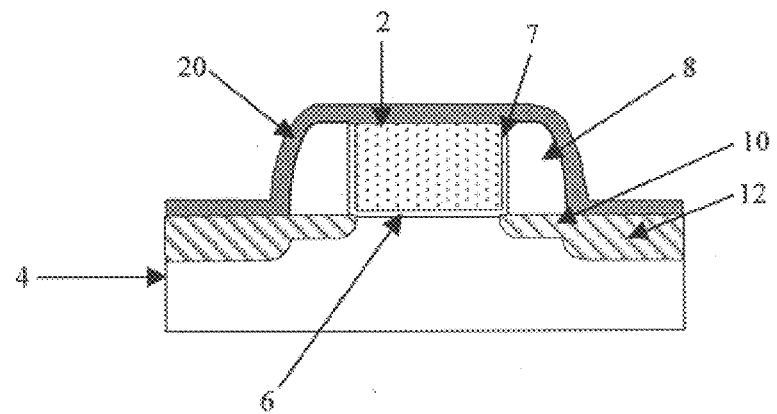

Adverting to FIG. 2, a Ni layer 20 is deposited over the wafer surface. The wafer is then subject to annealing to react Ni with the underlying Si.

Figure 3:
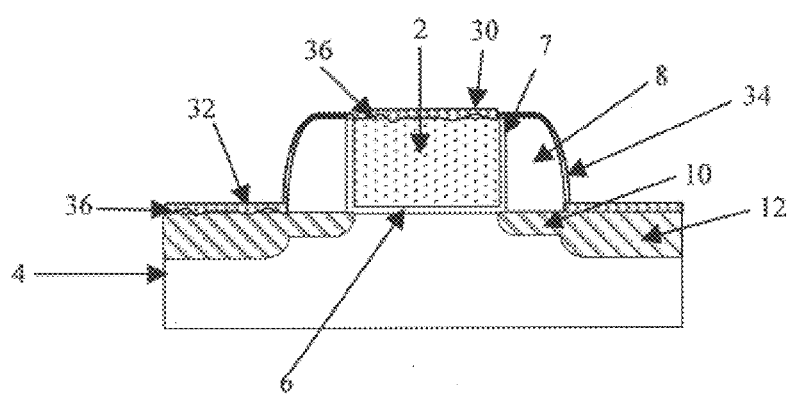

As shown in FIG. 3, following heating, a nickel silicide layer 30 is formed on the upper surface of gate electrode 2 and a layer of nickel silicide 32 is formed on associated source/drain regions 12. In conventional nickel silicidation processes, heating is conducted at a temperature of about 400° C. or greater. This temperature level is required to drive the reaction between the deposited Ni and underlying Si to form low resistivity nickel silicide, e.g., NiSi, versus high resistivity nickel silicides, e.g., $Ni_2Si$ or $Ni_3Si$, on the upper surface of gate electrode 2 and on associated source/drain regions 12. However, it was found that a thin layer of nickel silicide 34, as at a thickness of about 30 Å to 60 Å, is undesirably formed along the exposed surfaces of silicon nitride sidewall spacers 8 causing bridging and, hence, shorting between nickel silicide layer 30 and nickel silicide layers 32.

Rough interfaces 36 between the nickel silicide layers 30 and 32 and the underlying Si of the gate electrode 2 and the associated source/drain regions 12 also result from conventional nickel silicidation. Rough interfaces adversely affect semiconductor device performance by causing junction leakage and spiking, and limiting the thickness to which the silicide layer can be grown.

After considerable experimentation and investigation, it was postulated that the high temperatures at which heating, as by rapid thermal annealing or furnace annealing, typically occurs to form low resistivity nickel silicide, e.g., NiSi, results in rough interfaces 36 between the nickel silicide layers 30 and 32 and the underlying Si of the gate electrode 2 and the associated source/drain regions 12. It was also postulated that the problem of nickel silicide formation 34 along the surface of silicon nitride sidewall spacers 8 resulted when heating caused nickel silicide to creep out of the active regions to form conductive bridges between the nickel silicide layer 30 on gate electrode 2 and the nickel silicide layers 32 on associated source/drain regions 12. The present invention addresses and solves such problems by implanting Ni in the active regions to catalyze the reaction between subsequently deposited Ni and the underlying Si, thereby enabling a reduction in the nickel silicidation temperature.

In accordance with embodiments of the present invention, Ni is implanted into the gate electrode and/or source/drain regions prior to Ni deposition and annealing. It was found that the Ni implants advantageously catalyze the reaction between deposited Ni and Si in the gate electrode and source/drain regions, thereby facilitating low resistivity nickel silicide, e.g., NiSi, formation at reduced annealing temperatures. The reduced annealing temperature beneficially prevents nickel silicide from creeping out of the active regions onto the surface of the silicon nitride sidewall spacers, thereby avoiding metal silicide bridging, such as that denoted by reference numeral 34 in FIG. 3. The reduced annealing temperature also avoids the formation of rough interfaces between the nickel silicide layer and the underlying Si of the gate electrode and associated source/drain regions.

Figure 4:
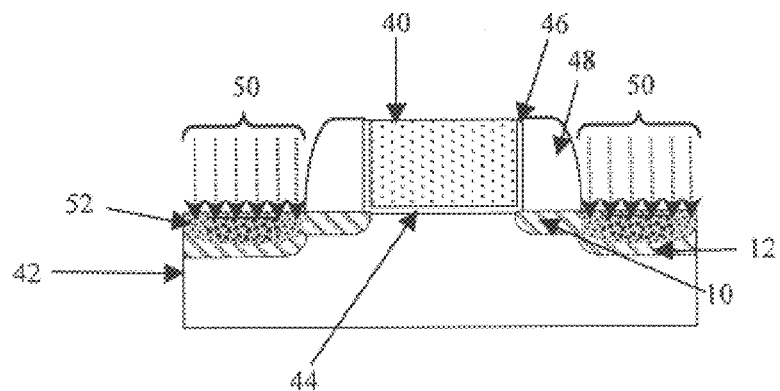
FIGS. 4–6 schematically illustrate a method in accordance with an embodiment of the present invention using ion implantation to catalyze nickel silicide formation while avoiding conductive bridging between the nickel silicide layer on the gate electrode and the nickel silicide layers on the associated source/drain regions and rough interfaces between the nickel silicide layers and the underlying silicon layers.
Figure 5:
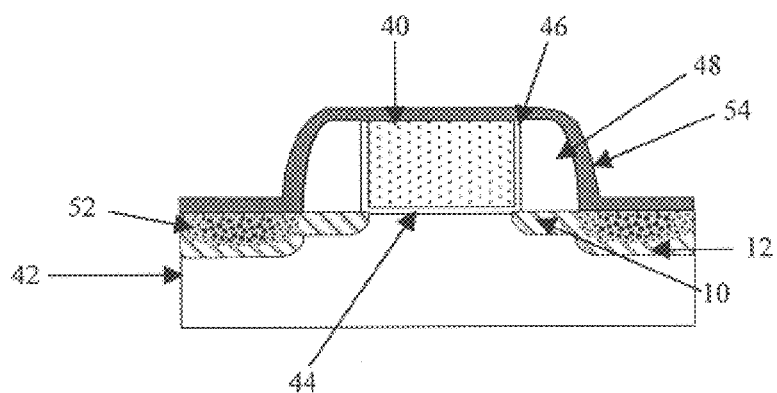
Figure 6:
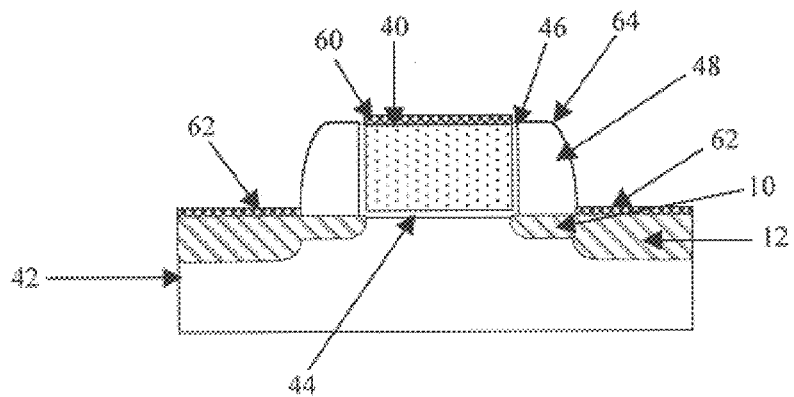

An embodiment of the present invention is illustrated in FIGS. 4 through 6, wherein similar reference numerals denote similar features. Adverting to FIG. 4, a gate electrode 40, e.g., doped polycrystalline silicon, is formed on substrate 42, which can be n-type or p-type doped silicon, with a gate insulating layer 44 therebetween. Gate insulating layer 44 is typically silicon dioxide formed by thermal oxidation or chemical vapor deposition (CVD). An oxide liner 46 is disposed on the opposing side surfaces of gate electrode 40 as a buffer between silicon nitride sidewall spacers 48 and the side surfaces of the gate electrode 40. Subsequent to forming an oxide liner 46, silicon nitride sidewall spacers 48 are formed by depositing a conformal layer of silicon nitride and anisotropic etching. Silicon nitride sidewall spacers 48 can be formed by plasma-enhanced chemical vapor deposition (PECVD).

As depicted in FIG. 4, with the silicon nitride sidewall spacers 48 in place, Ni ions 50 are implanted in exposed active regions in the wafer, e.g., in the source/drain regions 12 or the gate electrode 40, to create a Ni ion distribution 52, thereby amorphizing an upper portion of the source/drain regions 12.

The Ni ions are implanted at an implantation dosage of approximately $1E14/cm^2$ to approximately $1E15/cm^2$, e.g., approximately $4E14/cm^2$ and an implantation energy between about 20 keV to about 70 keV, for example between about 30 keV to about 60 keV, e.g., about 40 keV to about 50 keV.

According to embodiments of the present invention, the source/drain regions 12 extend in the substrate to a depth of approximately 300 Å to approximately 1500 Å. The Ni ions are implanted into the source/drain regions 12 at a depth no greater than the desired full depth of the nickel silicide layer.

As depicted in FIG. 5, a Ni layer 54 is deposited, as by sputtering in a conventional deposition chamber or other conventional method, over the wafer.

Turning to FIG. 6, in order to achieve the desired nickel silicide layer, e.g., NiSi, and to recrystallize the ion implanted amorphized portions, the wafer is heated, e.g., as by rapid thermal annealing or furnace annealing, to react the deposited Ni with underlying Si to form a nickel silicide layer 60 on the gate electrode 40 and to form nickel silicide layers 62 on the source/drain regions 12. In an embodiment of the present invention, heating is conducted at a reduced temperature of approximately 300° C. to approximately 400° C., e.g., approximately 325° C. to approximately 375° C., to effect nickel silicidation vis-à-vis the conventional temperature of 400° C. or greater. During heating, a nickel silicide layer 60, e.g., NiSi, is formed on the gate electrode 40 and nickel silicide layers 62 are formed on the source/drain regions 12, as in approximately 30 seconds to approximately 60 seconds, e.g., approximately 45 seconds.

Unreacted Ni on the wafer is then easily removed, as by wet chemical stripping. In an embodiment of the present invention, the unreacted Ni is removed by immersing the wafer into a solution of $H_2SO_4$, $H_2O_2$ and water (SPM) or a solution of $NH_4OH$, $H_2O_2$ and water (APM).

Embodiments of the present invention beneficially enable low resistivity nickel silicide, e.g., NiSi, formation without rough interfaces or bridging, thereby improving semiconductor performance. This is achieved by implanting Ni ions in the active regions, e.g., the source/drain regions 12 and/or the gate electrode 40, prior to Ni deposition and heating, to catalyze nickel silicidation. In embodiments of the present invention, Ni ion implantation enables a reduction in the temperature at which annealing is conducted, down to a temperature of approximately 300° C. to approximately 400° C. The present invention advantageously allows annealing to occur at temperatures sufficient to form NiSi layers 60 and 62 on the polysilicon gate electrode 40 and source/drain regions 12 while avoiding rough interfaces, like those denoted by reference numeral 36 in FIG. 3, between the nickel silicide layers 60 and 62 and the underlying silicon.

The reduced annealing temperatures associated with embodiments of the present invention further improve semiconductor device performance by preventing or significantly reducing nickel silicide creeping out of the active regions to form conductive bridges between the nickel silicide layer 60 on the gate electrode 40 and the nickel silicide layers 62 on associated source/drain regions 12, particularly when using silicon nitride sidewall spacers 48. This beneficially eliminates a cause of electrical shorts between different regions of the semiconductor device.

Another aspect of the present invention relates to a semiconductor device that includes a polysilicon gate electrode 40, source/drain regions 12, and silicon nitride sidewall spacers 48, wherein NiSi layers 60 and 62 are present on the gate electrode 40 and source/drain regions 12. The NiSi layers 60 and 62 are created by initially implanting Ni ions in the exposed active regions in the wafer, depositing a Ni layer 54 over the wafer, heating to recrystallize the implanted silicon and to react the deposited Ni layer 54 with underlying Si in the polysilicon gate electrode 40 and source/drain regions 12 to form NiSi layers 60 and 62 on the polysilicon gate electrode 40 and source/drain regions 12 respectively, and wet chemical etching the unreacted Ni from the wafer.

The present invention enjoys industrial applicability in fabricating any of various types of semiconductor devices. The present invention has particular applicability in devices with high circuit speeds having design features in the deep sub-micron regime.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein. Well-known processing structures have not been described in detail in order not to unnecessarily obscure the present invention.

What is claimed is:

1. A method of manufacturing a semiconductor device, the method comprising the steps of:

forming a silicon gate electrode, having an upper surface and side surfaces, overlying a silicon substrate with a gate dielectric layer therebetween and exposed source/drain regions in the substrate, an oxide liner disposed on the side surfaces, and a silicon nitride sidewall spacer disposed on the oxide liner;

implanting nickel (Ni) ions into the exposed source/drain regions to amorphize an upper portion thereof;

depositing a Ni layer;

heating to react the deposited Ni with underlying Si to form a nickel silicide layer on the gate electrode and a nickel silicide layer on the source/drain regions and to recrystallize the source/drain regions; and removing unreacted Ni.

2. The method of claim 1, wherein the source/drain regions extend in the substrate to a depth of approximately 300 Å to approximately 1500 Å.

3. The method of claim 1, comprising implanting Ni ions into the upper surface of the gate electrode.

4. The method of claim 1, comprising implanting Ni ions at an implantation dosage of approximately $1E14/cm^2$ to approximately $1E15/cm^2$.

5. The method of claim 4, comprising implanting Ni ions at an implantation dosage of approximately $4E14/cm^2$.

6. The method of claim 1, comprising implanting Ni ions at an implantation energy of about 20 keV to about 70 keV.

7. The method of claim 6, comprising implanting Ni ions at an implantation energy of about 30 keV to about 60 keV.

8. The method of claim 7, comprising implanting Ni ions at an implantation energy of about 40 keV to about 50 keV.

9. The method of claim 1, comprising implanting Ni ions in the exposed source/drain regions at a depth no greater than the depth of the subsequently formed nickel silicide layer.

10. The method of claim 1, comprising heating at a temperature of approximately 300° C. to approximately 400° C. to form the nickel silicide layer on the gate electrode and source/drain regions and to recrystallize the source/drain regions.

11. The method of claim 10, comprising heating at a temperature of approximately 325° C. to approximately 375° C. to form the nickel silicide layer on the gate electrode and source/drain regions and to recrystallize the source/drain regions.

12. The method of claim 10, comprising heating for approximately 30 seconds to approximately 60 seconds to form the nickel silicide layer on the gate electrode and source/drain regions.

13. The method of claim 12, comprising heating for approximately 45 seconds to form the nickel silicide layer on the gate electrode and source/drain regions.

14. The method of claim 1, comprising heating to form the nickel silicide layer on the polysilicon gate electrode and source/drain regions, wherein the nickel silicide layer is the low resistivity NiSi form.

15. The method of claim 1, comprising removing the unreacted nickel by wet chemical etching.

16. The method of claim 15, comprising wet chemical etching by immersing the wafer in a solution of $NH_4OH$, $H_2O_2$ and water (APM) or immersing the wafer in a solution of $H_2SO_4$, $H_2O_2$ and water (SPM).

* * * * *